US012804977B2

(12) United States Patent
Fiorenza et al.

(10) Patent No.: US 12,804,977 B2
(45) Date of Patent: Nov. 17, 2026

(54) SiC-BASED ELECTRONIC DEVICE WITH IMPROVED GATE DIELECTRIC AND MANUFACTURING METHOD THEREOF, DIODE

(71) Applicant: STMicroelectronics S.r.l., Agrate Brianza (IT)

(72) Inventors: Patrick Fiorenza, Belpasso (IT); Fabrizio Roccaforte, Mascalucia (IT); Edoardo Zanetti, Valverde (IT); Mario Giuseppe Saggio, Aci Bonaccorsi (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 569 days.

(21) Appl. No.: 18/364,180

(22) Filed: Aug. 2, 2023

(65) Prior Publication Data

US 2024/0079455 A1 Mar. 7, 2024

(30) Foreign Application Priority Data

Aug. 29, 2022 (IT) ........................ 102022000017730

(51) Int. Cl.

| | |
|---|---|
| ***H10D 62/832*** | (2025.01) |
| ***H10D 8/60*** | (2025.01) |
| ***H10D 12/01*** | (2025.01) |
| ***H10D 64/68*** | (2025.01) |

(52) U.S. Cl.

CPC ........... *H10D 62/8325* (2025.01); *H10D 8/60* (2025.01); *H10D 12/031* (2025.01); *H10D 64/681* (2025.01)

(58) Field of Classification Search

None

See application file for complete search history.

(56) References Cited

U.S. PATENT DOCUMENTS

| | | | |
|---|---|---|---|
| 4,542,400 | A | 9/1985 | Hiraki et al. |
| 5,900,648 | A | 5/1999 | Harris et al. |
| 6,482,704 | B1 | 11/2002 | Amano et al. |

(Continued)

FOREIGN PATENT DOCUMENTS

| | | | |
|---|---|---|---|
| CN | 105431947 | A | 3/2016 |
| EP | 2221859 | A1 | 8/2010 |

(Continued)

OTHER PUBLICATIONS

Afanas'ev et al., "Band alignment and defect states at SiC/oxide interfaces," *J. Phys.: Condens. Matter* 16:S1839-S1856, 2004.

(Continued)

*Primary Examiner* — Xiaoming Liu

(74) *Attorney, Agent, or Firm* — Seed Intellectual Property Law Group LLP

(57) ABSTRACT

Electronic device comprising: a semiconductor body, in particular of Silicon Carbide, SiC, having a first and a second face, opposite to each other along a first direction; and an electrical terminal at the first face, insulated from the semiconductor body by an electrical insulation region. The electrical insulation region is a multilayer comprising: a first insulating layer, of a Silicon Oxide, in contact with the semiconductor body; a second insulating layer on the first insulating layer, of a Hafnium Oxide; and a third insulating layer on the second insulating layer, of an Aluminum Oxide.

20 Claims, 3 Drawing Sheets

(56) References Cited

U.S. PATENT DOCUMENTS

| | | | | |
|---|---|---|---|---|
| 6,617,653 | B1 | 9/2003 | Yokogawa et al. | |
| 8,772,785 | B2 | 7/2014 | Okamoto et al. | |
| 8,981,460 | B2 | 3/2015 | Sin et al. | |
| 9,685,503 | B2 | 6/2017 | Aketa | |
| 11,316,025 | B2 | 4/2022 | Fiorenza et al. | |
| 2002/0153579 | A1 * | 10/2002 | Yamamoto | H10D 64/0134 438/785 |
| 2003/0073270 | A1 | 4/2003 | Hisada et al. | |
| 2007/0045631 | A1 | 3/2007 | Endo et al. | |
| 2012/0018798 | A1 | 1/2012 | Mauder et al. | |
| 2012/0176183 | A1 | 7/2012 | Tanaka et al. | |
| 2013/0234163 | A1 * | 9/2013 | Hamamura | H10D 30/0291 257/77 |
| 2013/0240906 | A1 | 9/2013 | Shimizu et al. | |
| 2013/0341632 | A1 | 12/2013 | Chu | |
| 2014/0175457 | A1 | 6/2014 | Yen et al. | |
| 2015/0179744 | A1 | 6/2015 | Mine et al. | |
| 2016/0163792 | A1 * | 6/2016 | Oka | H10D 8/411 257/636 |
| 2016/0284804 | A1 | 9/2016 | Shimizu et al. | |
| 2018/0026131 | A1 | 1/2018 | Kurosaki et al. | |
| 2019/0081136 | A1 | 3/2019 | Yen et al. | |
| 2020/0020780 | A1 * | 1/2020 | Kim | H10D 1/692 |
| 2022/0208977 | A1 | 6/2022 | Fiorenza et al. | |
| 2024/0258380 | A1 | 8/2024 | Kimoto et al. | |
| 2025/0015155 | A1 | 1/2025 | Fiorenza et al. | |

FOREIGN PATENT DOCUMENTS

| | | | |
|---|---|---|---|
| JP | 2004193288 | A | 7/2004 |
| JP | 2015069989 | A | 4/2015 |
| JP | 2016195225 | A | 11/2016 |

OTHER PUBLICATIONS

Arith et al., "Increased Mobility in Enhancement Mode 4H—SiC MOSFET Using a Thin $SiO_2$ / $Al_2O_3$ Gate Stack," *IEEE Electron Device Letters* 39(4):564-567, Apr. 2018.

Bakowski et al., "Development of 3C—SiC MOSFETs," *Journal of Telecommunications and Information Technology* 2:49-56, 2007.

Cherkaoui et al., "Investigating positive oxide charge in the SiO2/3C—SiC MOS system," *AIP Advances* 8(085323):2018, 8 pages.

Compound Semiconductor magazine, "EV Group Heterogeneous integration," vol. 21, Issue 1, 2015.

Greco et al., "Conduction Mechanisms at Interface of AlN/SiN Dielectric Stacks with AlGaN/GaN Heterostructures for Normally-off High Electron Mobility Transistors: Correlating Device Behavior with Nanoscale Interfaces Properties," *ACS Appl. Mater. Interfaces* 9:35383-35390, 2017.

Lichtenwalner et al., "High-mobility enhancement-mode 4H—SiC lateral field-effect transistors utilizing atomic layer deposited $AI_2O_3$ gate dielectric," *Applied Physics Letters* 95, 152113, 2009, 4 pages.

Lo Nigro et al., "Nanolaminated $AI_2O_3$/$HfO_2$ dielectrics for silicon carbide based devices," *J. Vac. Sci. Technol. A* 38, 032410, Apr. 2020, 7 pages.

Roberts et al., "Control of threshold voltage in E-mode and D-mode GaN-on-Si metal-insulator-semiconductor heterostructure field effect transistors by in-situ fluorine doping of atomic layer deposition Al2O3 gate dielectrics," *Applied Physics Letters* 108(072901):2016, 5 pages.

Schiliró et al., "Negative charge trapping effects in $AI_2O_3$ films grown by atomic layer deposition onto thermally oxidized 4H—SiC," *AIP Advances* 6, 075021, Jul. 2016, 8 pages.

Schöner et al., "Realisation of Large Area 3C—SiC MOSFETs," *Materials Science Forum* 483-485:801-804, 2005.

Terasawa et al., "Crystallization process of high-k gate dielectrics studied by surface X-ray diffraction," *Applied Surface Science* 244:16-20, 2005.

Uchida et al., "High Temperature Performance of 3C—SiC MOSFETs with High Channel Mobility," *Materials Science Forum* 717-720:1109-1112, 2012.

Yole Development, "SiC technologies adoption is going to accelerate with a tipping point in 2019," Aug. 2017, p. 1-4.

* cited by examiner

SiC-BASED ELECTRONIC DEVICE WITH IMPROVED GATE DIELECTRIC AND MANUFACTURING METHOD THEREOF, DIODE

BACKGROUND

Technical Field

The present disclosure relates to an electronic device, in particular a power MOSFET or a Schottky diode, and to a manufacturing method of the electronic device.

Description of the Related Art

As is known, semiconductor materials having a wide bandgap, in particular having a high value of the bandgap, low on-state resistance ($R_{ON}$), high value of thermal conductivity, high operating frequencies and high saturation velocity of charge carriers, are ideal for producing electronic components, such as diodes or transistors, in particular for electrical applications. A material having said characteristics, and adapted to be used for manufacturing electronic components, is silicon carbide (SiC). In particular, silicon carbide, in its different polytypes (e.g., 3C—SiC, 4H—SiC, 6H—SiC), is preferable to silicon as regards the properties listed above.

The hexagonal SiC polytype (4H—SiC) is by far the most studied polytype and mass production of 4H—SiC wafers are currently commercially available, albeit at a higher cost than typical silicon wafers. The 3C—SiC has a significant cost advantage over 4H—SiC as it may be grown directly on Si by CVD deposition. The availability of 3C—SiC epitaxial layers of good quality of Silicon enables the implementation of cost-effective SiC-based power devices, for example adapted to work in the interval 650V-1200V.

Electronic devices provided with a silicon carbide substrate, compared to similar devices provided with a silicon substrate, have further advantages, such as low output resistance in conduction, low leakage current, and high operating frequencies. In particular, SiC Schottky diodes have demonstrated higher switching performances, making SiC electric devices particularly favorable for high-frequency applications.

Numerous scientific papers have also reported good switching performances of silicon carbide (SiC) MOSFET devices. From an industrial point of view, in addition to switching performances, SiC MOSFET devices also have good structural robustness which is a desirable characteristic in power systems.

A relevant structural element in SiC (in particular 4H—SiC) MOSFET devices is the gate dielectric (or oxide). The properties of the gate dielectric (permittivity, fixed charges, etc.) and the dielectric/SiC interface quality (interface state density $D_{it}$, near interface oxide traps, NIOTs) have a significant impact on relevant parameters of the MOSFET, such as the field effect channel mobility $\mu_{FE}$, the ON-state resistance and the threshold voltage $V_{th}$. Therefore, the gate dielectric optimization is the prerequisite for fully exploiting the performances of SiC MOSFETs.

Furthermore, in designing a MOSFET, a solution should be found to overcome the undesired reduction of the $V_{th}$ when the on-state resistance is decreased. In particular, a solution is desirable to increase the $V_{th}$ while maintaining a low on-state resistance.

Silicon oxide ($SiO_2$) is commonly used in commercial SiC MOSFETs as a gate dielectric, owing to the ease of manufacturing by thermal oxidation of SiC. However, the oxidation rate of SiC is lower than that of Silicon and the interface state density is of about 2-3 orders of magnitude higher than that of the $SiO_2$/Si stack. To reduce the interface state density $D_{it}$ and improve the channel mobility $\mu_{FE}$ of 4H—SiC MOSFETs that use $SiO_2$ as gate dielectric, a post-oxidation annealing (POA) or post-deposition annealing (PDA) step is typically performed in environments rich in nitrogen ($N_2O$, NO). However, thermal oxidation of SiC, as well as POA and PDA processes, typically require high temperatures (>1100° C.) and long annealing times (up to 8 hours in some cases). Furthermore, all these processes lead to the formation of a "disordered" region at the $SiO_2$/SiC interface as a consequence of the inevitable interfacial reoxidation that occurs during high-temperature annealing with NO or $N_2O$. This disordered interface is characterized by the presence of $SiO_x$ and C non-stoichiometric defects, which have a negative effect on both channel mobility and stability of the threshold voltage ($V_{th}$).

Furthermore, due to the low permittivity of $SiO_2$ compared to 4H—SiC, under high-voltage operating conditions the electric field inside the $SiO_2$ is about 2.5 times higher than that of SiC. Therefore, when the electric field reaches the critical field of 4H—SiC (which is about 3-4 MV/cm), the $SiO_2$ gate dielectric, according to Gauss's law, is subject to an electric field of about 2.3 times greater, i.e., about 7-9 MV/cm. Therefore, the $SiO_2$ dielectric will be under high-stress and poor-reliability conditions.

According to a solution known to the Applicant, in order to reduce the thermal budget necessary for the SiC oxidation, the $SiO_2$ layers deposited by CVD may be used as gate insulators in $SiO_2$ MOSFETs.

According to a solution known to the Applicant, high-permeability dielectrics (such as $Al_2O_3$, $HfO_2$, $La_2O_3$) have been proposed to attenuate the electric field in the gate insulator. However, in this process, a $SiO_2$ layer may form at the interface, resulting in the creation of carbon-related defects (such as vacancies, interstitials, C—C dimers, carbon clusters, etc.) which may give rise to instability of the voltage $V_{FB}$ (flat-band voltage) in MOSCAPs ("Metal Oxide Semiconductor Capacitors").

According to a solution known to the Applicant, $Al_2O_3$ films have been proposed as gate insulators to adjust the $V_{th}$ value in the SiC MOSFETs. High-k insulators (known as "high-k" materials) may be used, in particular, to increase the $V_{th}$ value in on-state in SiC MOSFETs. However, the integration of high-k dielectrics is limited by their susceptibility to crystallization phenomena at the thermal budgets required for forming contacts in SiC devices (>800° C.). Furthermore, the bandgap of the insulators decreases as their permittivity increases; consequently, the choice of a simple high-k generally causes a small band-offset with SiC and, consequently, a high leakage current.

The need is therefore felt to provide a solution to the problems set forth above.

BRIEF SUMMARY

According to the present disclosure, an electronic device and a manufacturing method thereof are provided, as defined in the attached claims.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1:
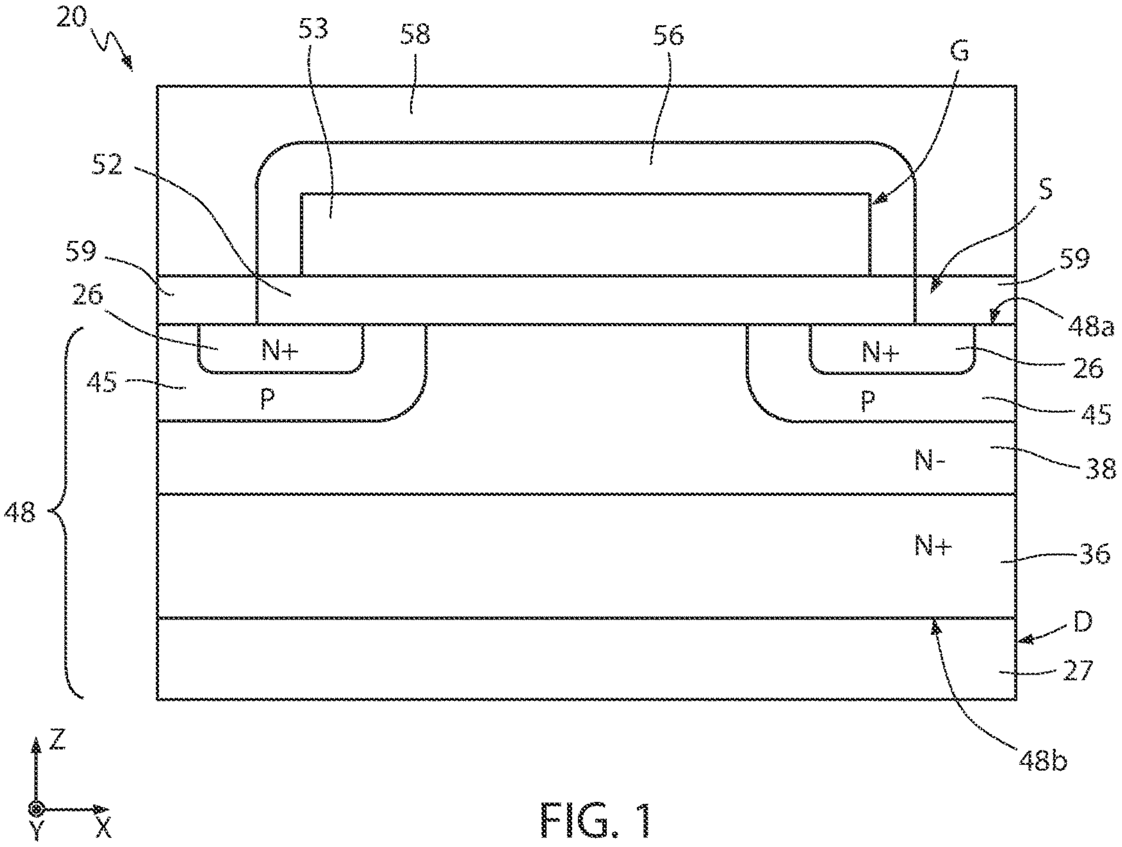
FIG. 1 illustrates, in lateral sectional view, a MOSFET device according to an aspect of the present disclosure.

FIG. 1 illustrates, in sectional view in a Cartesian (triaxial) reference system of axes X, Y, Z, a transistor 20, in particular a vertical-channel MOSFET, even more in particular a power MOSFET, according to an aspect of the present disclosure. The transistor 20 comprises: a gate terminal G (forming a control terminal) couplable, in use, to a generator of a biasing voltage $V_{GS}$; a first conduction terminal S, including a source region 26 (N-type implanted region) and a source metallization 59 (for example of Nickel, which forms an ohmic electrical contact with the source region 26); and a second conduction terminal D or drain region D (including a drain metallization 27, for example of Nickel, which forms an ohmic electrical contact). In use, with suitable biasing, a conductive channel of majority carriers (here, electrons) is established between the source region 26 and the drain region 27.

In greater detail, the transistor 20 comprises a semiconductor body 48, in particular of SiC, having a first and a second face 48*a*, 48*b* opposite to each other along the direction of the Z axis. In particular, in the present embodiment, the term "semiconductor body" means a structural element or solid body that may comprise one or more epitaxial layers grown on a base substrate. In particular, FIG. 1 illustrates a semiconductor body 48 including a base substrate 36 having an epitaxially grown structural layer 38 extending thereon, acting as a drift layer. The substrate 36 has a first conductivity, here of N-type, and doping for example comprised between $1 \cdot 10^{18}$ $cm^3$ and $5 \cdot 10^{19}$ $cm^3$. The structural layer 38 has the first conductivity, here of N-type, and lower doping than that of the substrate 36, for example comprised between $1 \cdot 10^{14}$ $cm^{-3}$ and $5\text{-}10^{16}$ $cm^{-3}$.

According to one aspect of the present disclosure, the polytype of the semiconductor body 48 is the cubic polytype of Silicon Carbide, or 3C—SiC. Alternatively, and according to a further aspect of the present disclosure, the polytype of the semiconductor body 48 is 4H—SiC. However, the present disclosure also finds application for further and different silicon carbide polytypes.

The gate terminal G extends on the first face 48*a* of the semiconductor body 48; a body region 45, having a second conductivity opposite to the first conductivity (here, a P-type implanted region), extends into the semiconductor body 48 (more in particular, into the structural layer 38) at (facing) the first face 48*a*; the source region 26, having the first conductivity, extends into the body region 45 at (facing) the first surface 48*a*; and the drain metallization 27 extends at the second face 48*b* of the semiconductor body 48. The transistor 20 is therefore of vertical-conduction type (i.e., the conductive channel extends along a main direction which is along the Z axis).

The gate terminal G includes a gate metallization 53, and a gate dielectric 52. The gate metallization 53 extends on the gate dielectric 52.

Figure 2:
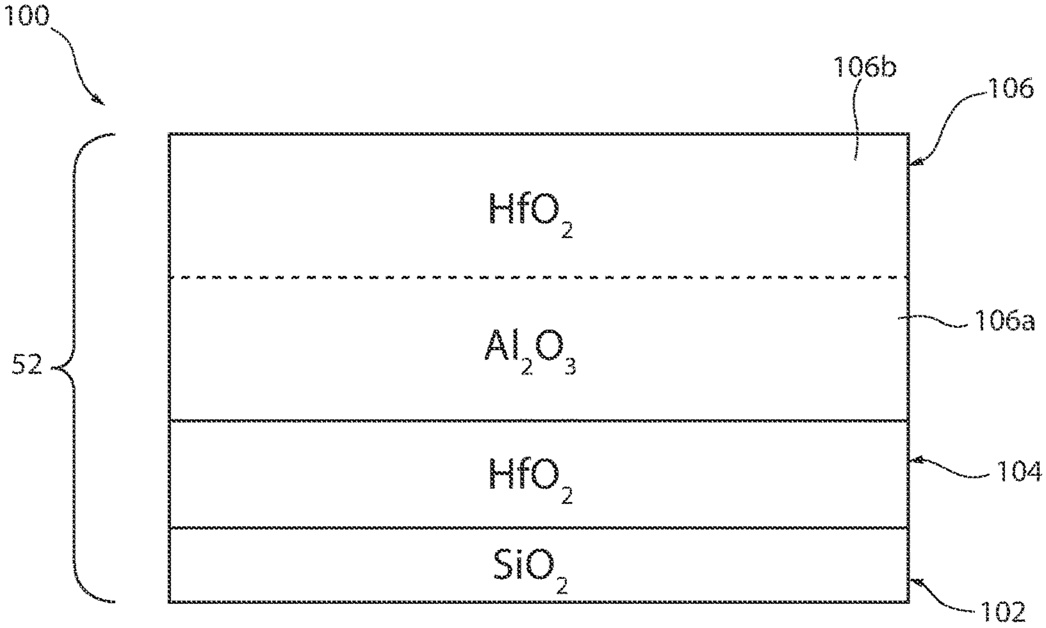
FIG. 2 illustrates an enlarged detail of a stack which forms the gate dielectric of the device of FIG. 1, according to an aspect of the present disclosure.

According to the present disclosure, the gate dielectric 52 is a stack, 100 including a plurality of superimposed layers, as illustrated in FIG. 2 and described hereinbelow with reference to this Figure.

An insulating, or dielectric, layer 56 extends on the gate region 24 and is, in particular, of silicon dioxide ($SiO_2$) or silicon nitride (SiN) with a thickness, measured along the Z axis, comprised between 0.5 μm and 1.5 μm. Furthermore, a source terminal 58, in particular of metal material, for example Aluminum, with a thickness, measured along the Z axis, comprised between 0.5 μm and 2 μm, extends in proximity of the insulating layer 56.

The source terminal 58 extends up to contacting the source region 26, possibly through an ohmic contact region 59, optional.

The metal layer 27, for example of Ti/Ni/Au, which forms the gate terminal D, extends on the second face 48*b* of the semiconductor body 48. An interface layer to allow the ohmic contact, not shown, for example of nickel silicide, may be present between the semiconductor body 48 and the metal layer 27.

With reference to the gate dielectric 52 and to FIG. 2, the stack that forms, as a whole, the gate dielectric 52 is designed in such a way as to have a high density of electron traps, inducing (increasing) the negative charge density inside the gate dielectric (in particular in the layer 104), during use. In particular, the stack 100 is an insulating multilayer which has at least an energy level that is in energetic proximity (e.g., between 0 eV and 2 eV) of the conduction band of the semiconductor material (e.g., SiC) of the body 48.

In particular, the stack 100 comprises: a first insulating layer 102, in particular of Silicon Oxide ($SiO_2$), having a thickness, along Z, comprised between 0.5 nm and 5 nm; a second insulating layer 104 on the first insulating layer 102, in particular of Hafnium Oxide ($HfO_2$), having a thickness, along Z, comprised between 0.5 nm and 5 nm; a third insulating layer 106 on the second insulating layer 104, in particular of an alloy including aluminum (e.g., $Al_2O_3$, AlN, AlON), having a thickness, along Z, comprised between 10 nm and 100 nm. In one embodiment, the third insulating layer 106 is formed by a plurality of (e.g., two) sub-layers 106*a*, 106*b*, wherein the sub-layer 106*a* is of Aluminum Oxide (e.g., $Al_2O_3$) and the sub-layer 106*b* is of a Hafnium Oxide (e.g., $HfO_2$).

Variants to what has been described above are possible, in particular the first insulating layer 102 may alternatively be of $Al_2O_3$, SiN or AlN; the second insulating layer 104 may alternatively be of $HfSiO_x$, $ZrO_2$, $ZrSiO_x$; the sub-layer 106*a* of the third insulating layer 106 may alternatively be of $AlSiO_x$ and/or the sub-layer 106*b* may alternatively be of $HfSiO_x$.

The insulating layer 102 has a reduced thickness to allow the tunneling of the electrons from the semiconductor body 48 and has a bandgap greater than the bandgap of the insulating layer 104. The insulating layer 102 therefore has a thickness such that it may be traversed by tunnel effect by the electrons which, confined in the potential well and in a number limited by the states allowed by the well, produce a positive $V_{th}$ of the MOSFET 20.

The layer which acts as a trap for the electric charges is the insulating layer 104, with a reduced bandgap, which forms a quantum-well between the insulating layer 102 and the insulating layer 106. In one embodiment, the hafnium oxide represents a potential well for the electrons confined on one side by the insulating layer 102 and on the other side by the insulating layer 106.

The insulating layer 106 is configured to have a bandgap greater than the bandgap of the insulating layer 104. Since the layer 106 comprises the two sub-layers 106a and 106b previously described (or a plurality thereof), it allows to combine the advantages of high bandgap (e.g., the $Al_2O_3$ bandgap which may be comprised between 7 and 9 eV) and high dielectric constant (e.g., the $HfO_2$ dielectric constant which is about 20).

In one embodiment:

- the first insulating layer 102 has a first bandgap value and a first thickness;
- the second insulating layer 104 has a second bandgap value lower than the first bandgap value and a second thickness greater than the first thickness; and
- the third insulating layer 106 has a third bandgap value comprised between the first and the second bandgap values and a third thickness greater than the second thickness.

In one embodiment:

- the first insulating layer 102 has a thickness comprised between 0.5 nm and 1 nm, extremes included, and a bandgap between 7 and 9 eV, extremes included; the insulating layer 102 is of $SiO_2$ or of one of the materials indicated above for this layer;
- the second insulating layer 104 has a thickness comprised between 1.5 nm and 2.5 nm, extremes included, and a bandgap between 4 and 6 eV, extremes included; the insulating layer 104 is of $HfO_2$ or of one of the materials indicated above for this layer;
- the third insulating layer 106 has a thickness comprised between 10 nm and 100 nm, extremes included, and a bandgap between 7 and 8.5 eV, extremes included; the insulating layer 106 is a multilayer comprising the layer 106a and the layer 106b, or a succession of a plurality of layers 106a and 106b alternated to each other.

The stack 100 according to the present disclosure, with respect to a single layer of a high-k material or of a set of sub-layers other than that described herein, allows to combine the advantages of high bandgap of the insulating layer 106 and the advantages of high dielectric constant of the insulating layer 104.

The stack 100 is steady, and has the aforementioned properties, when the materials forming it are amorphous (and non-crystalline). A further additional positive effect is that the proposed structure has a higher capacitance with respect to a gate dielectric of sole Silicon Oxide, allowing to have a higher RC constant, consequently limiting ringing phenomena induced by the fast switching of the MOSFET device 20.

Figure 3:
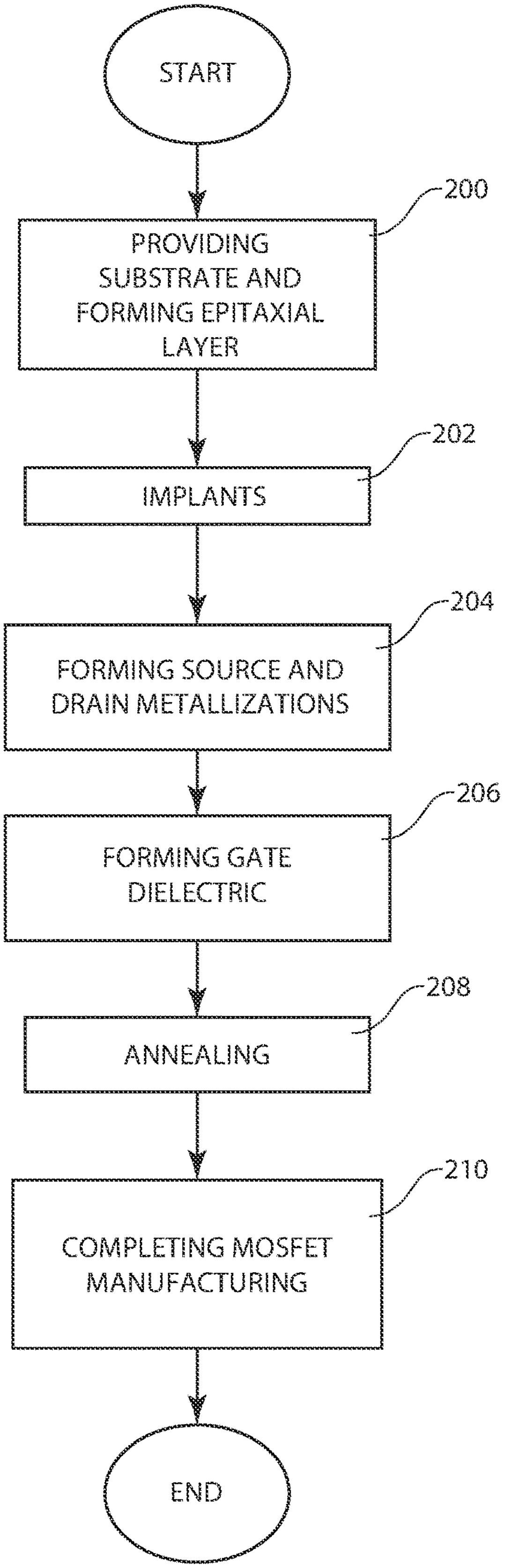
FIG. 3 illustrates, by a block diagram, steps of a manufacturing process of the device of FIG. 1.

With reference to the flowchart of FIG. 3, manufacturing steps of the MOSFET device 20 are now illustrated, with particular reference to the formation of the stack 100.

Step 200 comprises steps, known per se and therefore not described in detail, of forming the semiconductor body 48, including providing the substrate 36 and forming, on the substrate 36, the epitaxial layer 38 (by epitaxy).

Then, step 202, doping species implants are performed for forming the implanted regions 45 (body wells) and 26 (source regions). An annealing step is then performed (e.g., at a temperature comprised between 1600 and 1800° C.) for activating the dopants of the body 45 and source 26 implanted regions.

Then, step 204, the method proceeds with the formation of the source 59 and drain 27 metallizations (which form the respective ohmic contacts). This step includes depositing a metal layer (typically Ni, Ti, or a combination of Ni/Ti) at the source/body implants. This step is followed by a suitable high-temperature annealing (rapid thermal process, between 800° C. and 1100° C. for a time interval from 1 minute to 120 minutes). This allows the ohmic contacts (e.g., of Nickel Silicide, $Ni_2Si$, in the event that the metal layer is of Ni) to be formed, by chemical reaction between the deposited metal and the Silicon present in the semiconductor body 48 (which, in this embodiment, is of SiC). In fact, the deposited metal reacts where it is in contact with the surface material of the semiconductor body 48, forming the ohmic contact.

Then, step 206, steps are performed for forming the stack 100.

In particular, the first insulating layer 102 is formed by depositing a Silicon Oxide layer, on the semiconductor body 48 (more precisely on the epitaxial layer 38) between the source metallizations 59. This step may be implemented by thermal oxidation or by bath in oxidizing solution ($H_2O_2$). This step is performed at temperatures comprised between 900° C. and 1400° C. for times that may vary between 30 s and 5 minutes depending on the temperature. The baths in aqueous solution of hydrogen peroxide may be carried out in a range of temperatures comprised between room temperature (25° C.) up to temperatures of 80-90° C. for a duration that may reach 120 minutes.

Alternatively, the insulating layer 102 may be deposited by ALD ("Atomic Layer deposition") technique.

Then, the second insulating layer 104 is formed, on the first insulating layer 102, also by ALD technique. In one embodiment, the second insulating layer 104 is of $HfO_2$ and may be deposited by a thermal process or Plasma, using the parameters according to the following table:

| Method | Oxidizing source(O) | Purging flow | Hf precursor pulsing period | Oxygen pulsing period | Purging period | Deposition temperature |
|---|---|---|---|---|---|---|
| Thermal | $H_2O$ | $N_2$ (1-100 sccm) | 10-200 ms | 10-20 ms | 10-30 s | 200-300° C. |
| Plasma | $O_2$-plasma | $N_2$ (1-100 sccm) | 50-300 ms | 1-5 ms | 10-30 s | 200-300° C. |

Then, the third insulating layer 106 is formed, on the second insulating layer 106, also by ALD technique. In one embodiment, the third insulating layer 106 is of $Al_2O_3$ and may be deposited by a thermal process or Plasma, using the parameters according to the following table:

| Method | Oxidizing source(O) | Purging flow | Hf precursor pulsing period | Oxygen pulsing period | Purging period | Deposition temperature |
|---|---|---|---|---|---|---|
| Thermal | $H_2O$ | $N_2$ (1-100 sccm) | 10-200 ms | 10-50 ms | 2-5 s | 200-300° C. |
| Plasma | $O_2$-plasma | $N_2$ (1-100 sccm) | 50-300 ms | 0.1-1 s | 2-5 s | 200-300° C. |

As an alternative to deposition by ALD, one or all of the insulating layers 102, 104, 106 may be deposited by CVD technique, or reactive ion sputtering.

Then, step 208, a post-deposition annealing step is performed, in an environment containing oxygen, or in an inert environment such as Argon and/or Nitrogen.

Finally, step 210, the remaining steps are performed to complete the formation of the MOSFET device 20, including the formation of the gate conductive terminal (gate metallization 53 and insulating layer 56), in a per se known manner. The formation of the source terminal is also completed, forming the metallization 58.

With reference to the gate dielectric (stack 100), the latter is designed in such a way as to have a high density of electron traps.

Further specific treatments, as said, may allow the formation of electron traps. Such treatments include:

a. Annealing process in a reducing environment, to increase the oxygen vacancies (e.g., in a chamber with a gas from among $N_2$, Ar, $NH_3$).

b. Application of a voltage (e.g., positive) to the gate dielectric to allow an accumulation of charges in the insulating layer.

c. In-situ doping, through the introduction of electronegative atomic species (e.g., fluorine).

The negative charges that occur in the gate dielectric, as a consequence of what has been discussed above, compensate for the reduction of the threshold voltage $V_{th}$ of the device as the channel resistance decreases. A MOSFET device is thus obtained having a high threshold voltage $V_{th}$ and a low $R_{ON}$.

Figure 4:
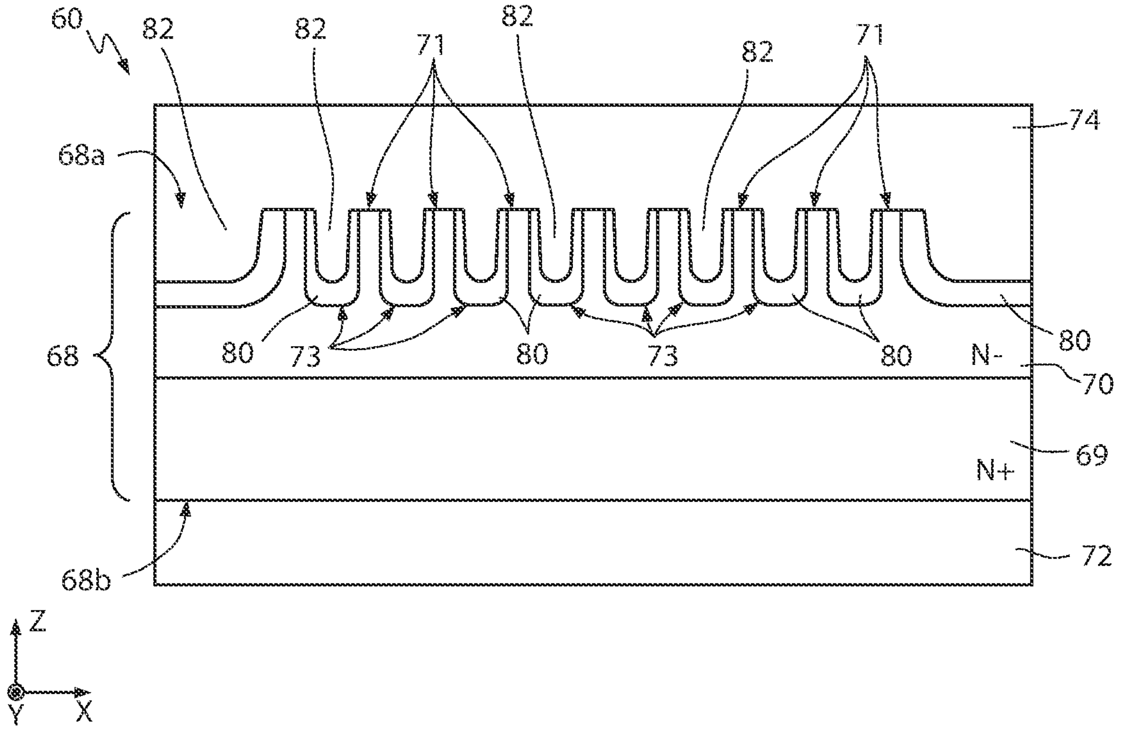
FIG. 4 illustrates, in lateral sectional view, a Schottky diode according to a further aspect of the present disclosure.

FIG. 4 shows a lateral sectional view, in a Cartesian (triaxial) reference system of axes X, Y, Z, a Schottky device (diode) 60.

The Schottky device 60 includes a semiconductor body 68, in particular of SiC, more particularly of 3C—SiC; however, what described herein also applies to other SiC polytypes, for example 4H—SiC. The semiconductor body 68 has a first and a second face 68*a*, 68*b* opposite to each other along the direction of the Z axis. In particular, in the present embodiment, the term “semiconductor body” means a structural element which may comprise one or more epitaxial layers grown on a base substrate. FIG. 4 illustrates, according to an embodiment, a semiconductor body 68 including a base substrate 69 having an epitaxially grown structural layer 70 extending thereon, acting as a drift layer. The substrate 69 has a first conductivity, here of N-type, and doping for example comprised between $1 \cdot 10^{18}$ $cm^{-3}$ and $5 \cdot 10^{19}$ $cm^{-3}$. The structural layer 70 has the first conductivity and doping lower than the doping of the substrate 69, for example comprised between $1 \cdot 10^{14}$ $cm^{-3}$ and $1 \cdot 10^{17}$ $cm^{-3}$.

The Schottky device 60 further includes a cathode terminal 72, of metal material, which extends on the second face 68*b* of the semiconductor body 68; and an anode terminal 74, of metal material, which extends on the first face 68*a* of the semiconductor body 68. In use, by suitable biasing, a conductive channel is established between the anode terminal and the cathode terminal.

The Schottky device 60 has one or more trenches 73 extending in depth into the semiconductor body 68, in particular into the drift layer 70, along a main direction parallel to the Z axis. Exemplarily, each trench 73 has a depth d1, measured from the first face 68*a* towards the second face 68*b*, having a value comprised between 100 nm and 1000 nm. In the event that multiple trenches 73 are present, each trench 73 is spaced from a trench 73 immediately adjacent, along the direction of the X axis, from a portion of the structural layer 70. This portion of the structural layer 70 has an extension d2, along the direction of the X axis, having a value comprised, for example, between 100 nm and 5000 nm.

Each trench 73 is partially filled by a dielectric or insulating layer 80, which covers the side walls and the bottom of each respective trench 73. Furthermore, the filling of each trench 73 is completed by conductive portions 82 of the anode terminal 74 which penetrate and/or cover the trenches 73. Each of the portions 82 is therefore insulated from the structural layer 70 by a respective insulating layer 80.

The insulating layer 80 is a multilayer, or stack, of the same type as the stack 100 previously described and formed according to the same process steps (described in step 206 of FIG. 3). Furthermore, the insulating layer 80 is designed in a manner similar to what has been described with reference to the dielectric layer 52 (stack 100), i.e., in such a way as to present a high number of traps for the majority carriers (here, electrons).

Schottky junctions 71 are formed by the plurality of metal-semiconductor junctions present at the interface between the drift layer 70 and the metal layer of the anode metallization 74. In particular, the Schottky junctions 71 (semiconductor-metal) are formed by portions of the drift layer 70 (N-doped) in direct electrical contact with respective portions of the anode metallization 74.

The presence of a net negative charge at the insulating layer 80 allows a positive charge balancing at the interface with the structural layer 70 and thus allows the interdiction characteristics of the diode 60 to be optimized. In particular, the surface depletion layer may be optimized by modifying both the switch-on voltage of the diode and the interdiction characteristics for negative biasing on the Schottky contact.

From an examination of the characteristics of the disclosure made according to the present disclosure, the advantages that it affords are evident.

According to the present disclosure it is in fact possible to reduce the thermal budget required for the manufacturing of the gate terminal, increase the reliability of the gate dielectric, reduce the $R_{ON}$ and increase the $V_{th}$. These advantages are, at least in part, obtained owing to the high-permittivity high-k gate dielectric, whose properties may be adjusted by the process described above.

Finally, it is clear that modifications and variations may be made to what has been described and illustrated herein, without thereby departing from the scope of the present disclosure.

For example, the present disclosure may be applied to devices based on a SiC polytype other than 3C—SiC or 4H—SiC, in general transistors and diodes.

Furthermore, the present disclosure may be applied to devices based on a material other than SiC, for example GaN and AlGaN/GaN (normally-off HEMTs).

Furthermore, the present disclosure finds applications in various electronic devices other than those described in the aforementioned particular embodiments, for example VMOS ("Vertical-channel MOS"), DMOS ("Diffused MOS"), CMOS ("Complementary MOS").

The present disclosure is also applicable to horizontal-channel devices.

An electronic device (20; 60) may be summarized as including a semiconductor body (48; 68), in particular of Silicon Carbide, having a first (48*a*; 68*a*) and a second face (48*b*; 68*b*), opposite to each other along a first direction (Z); an electrical terminal (G; 82, 74) at the first face (48*b*; 68*b*), including a conductive layer (53) and an electrical insulation region (52; 80), the electrical insulation region (52; 80) extending between the semiconductor body (48; 68) and the conductive layer (53), characterized in that said electrical insulation region (52; 80) is a multilayer including a first insulating layer (102) in contact with the semiconductor body, having a first bandgap value and a first thickness, configured to be traversed by the tunnel effect, during use, by electric charge carriers coming from the semiconductor body (48; 68); a second insulating layer (104) on the first insulating layer (102), having a second bandgap value lower than the first bandgap value and a second thickness greater than the first thickness, configured to form a potential well for said electric charge carriers; and a third insulating layer (106) on the second insulating layer (104), having a third bandgap value between the first and the second bandgap values and a third thickness greater than the second thickness.

The first insulating layer (102) may have a thickness between 0.5 nm and 1 nm; the second insulating layer (104) may have a thickness between 1.5 nm and 2.5 nm; and the third insulating layer (106) may have a thickness between 10 and 100 nm.

The first insulating layer (102) may be of one from among: SiN, $SiO_2$, AlN; the second insulating layer (104) may be of one from among: $HfO_2$, $HfSiO_x$, $ZrO_2$, $ZrSiO_x$; and the third insulating layer (106) may include two or more alternating layers of an Aluminum Oxide and a Hafnium Oxide.

The third insulating layer (106) may include two or more alternating layers of $Al_2O_3$ and $HfO_2$, or two or more alternating layers of $AlSiO_x$ and $HfSiO_x$.

The electronic device may further include a channel region (38, 36; 69, 70) in said semiconductor body (48; 68), configured to accommodate, in use, an electric current, said electrical insulation region (52; 80) extending at said channel region.

The electronic device may have positive charge carriers at said first face (48*a*; 68*a*) defining a positive interface charge, said electrical insulation region (52; 80) may be designed in such a way as to have trap states of electrons, which generate a negative charge such as to balance, at least in part, said positive interface charge.

Said electronic device may be a MOSFET including a source terminal (S, 26, 59) and a drain terminal (D, 27), said electrical terminal being a gate terminal (G, 53) of the MOSFET, the conductive layer being a gate metallization (53), and the electrical insulation region (52) forming, as a whole, a gate dielectric.

Said electronic device may be a diode and may include a cathode terminal (72) extending at the second face (68*b*) of the semiconductor body (68); at least one trench (73) extending from the first face (68*a*) towards the second face (68*b*), said electrical insulation region (80) extending into said trench (73); wherein said electrical terminal may form an anode terminal (74) of the diode and includes a metal layer having a portion (82) extending into said trench (73), said electrical insulation region (80) extending between said portion (82) of the anode terminal (74) and the semiconductor body (68).

The diode may be a Schottky diode including at least one metal-semiconductor junction formed by an electrical contact region between the anode terminal (74) and the semiconductor body (68) laterally to said trench (73).

A method of manufacturing an electronic device (20; 60) may be summarized as including the steps of providing a semiconductor body (48; 68), in particular of Silicon Carbide, having a first (48*a*; 68*a*) and a second face (48*b*; 68*b*), opposite to each other along a first direction (Z); forming an electrical terminal (G; 82, 74) at the first face (48*b*; 68*b*), including forming a conductive layer (53) and an electrical insulation region (52; 80) between the conductive layer (53) and the semiconductor body (48; 68), configured to electrically insulate the electrical terminal (G; 82, 74) from the semiconductor body (48; 68), characterized in that the step of forming said electrical insulation region (52; 80) includes forming a multilayer, including forming a first insulating layer (102) in contact with the semiconductor body, having a first bandgap value and a first thickness, configured to be traversed, by tunnel effect, during use, by electric charge carriers coming from the semiconductor body (48; 68); forming a second insulating layer (104) on the first insulating layer (102), having a second bandgap value lower than the first bandgap value and a second thickness greater than the first thickness, configured to form a potential well for said electric charge carriers; and forming a third insulating layer (106) on the second insulating layer (104), having a third bandgap value between the first and the second bandgap values and a third thickness greater than the second thickness.

The first insulating layer (102) may have a thickness between 0.5 nm and 1 nm; the second insulating layer (104) may have a thickness between 1.5 nm and 2.5 nm; and the third insulating layer (106) may have a thickness between 10 and 100 nm.

The first insulating layer (102) may be of one from among: SiN, $SiO_2$, AlN; the second insulating layer (104) may be of one from among: $HfO_2$, $HfSiO_x$, $ZrO_2$, $ZrSiO_x$; and the third insulating layer (106) may include two or more alternating layers of an Aluminum Oxide and a Hafnium Oxide.

The third insulating layer (106) may include two or more alternating layers of Al2O3 and HfO2, or two or more alternating layers of AlSiOx and HfSiOx.

Forming the second and the third insulating layers (104, 106) may include performing respective depositions by ALD technique.

The method may further include a channel region (38, 36; 69, 70) in said semiconductor body (48; 68), configured to accommodate, in use, an electric current, said electrical insulation region (52; 80) being formed at said channel region.

Said electronic device is a MOSFET, the manufacturing steps may further include forming a source terminal (S, 26, 59) and a drain terminal (D, 27) of the MOSFET, said electrical terminal being a gate terminal (G, 53) of the MOSFET, the conductive layer (53) being a gate metallization (53), and the electrical insulation region (52) forming, as a whole, a gate dielectric.

Said electronic device may be a diode, the manufacturing steps may further include forming a cathode terminal (72) extending at the second face (68*b*) of the semiconductor body (68); forming at least one trench (73) extending from the first face (68*a*) towards the second face (68*b*), said electrical insulation region (80) extending into said trench (73);

wherein said electrical terminal may be an anode terminal (74) of the diode and may include a metal layer having a portion (82) extending into said trench (73), said electrical insulation region (80) extending between said portion (82) of the anode terminal (74) and the semiconductor body (68).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device comprising:

a semiconductor body of Silicon Carbide, having a first and a second face, opposite to each other along a first direction;

an electrical terminal at the first face, including a conductive layer and an electrical insulation region, the electrical insulation region extending between the semiconductor body and the conductive layer, wherein said electrical insulation region is a multilayer comprising:

a first insulating layer in contact with the semiconductor body, having a first bandgap value and a first thickness, configured to be traversed by the tunnel effect, during use, by electric charge carriers coming from the semiconductor body;

a second insulating layer on the first insulating layer, having a second bandgap value lower than the first bandgap value and a second thickness greater than the first thickness, configured to form a potential well for said electric charge carriers; and a third insulating layer on the second insulating layer, having a third bandgap value comprised between the first and the second bandgap values and a third thickness greater than the second thickness, wherein:

the first insulating layer is of one from among: SiN, $SiO_2$, AlN;

the second insulating layer is of one from among: $HfO_2$, $HfSiO_x$, $ZrO_2$, $ZrSiO_x$; and the third insulating layer includes two or more alternating layers of an Aluminum Oxide and a Hafnium Oxide.

2. The electronic device according to claim 1, wherein:

the first insulating layer has a thickness comprised between 0.5 nm and 1 nm;

the second insulating layer has a thickness comprised between 1.5 nm and 2.5 nm; and the third insulating layer has a thickness comprised between 10 and 100 nm.

3. The electronic device according to claim 1, wherein the third insulating layer includes two or more alternating layers of $Al_2O_3$ and $HfO_2$, or two or more alternating layers of $AlSiO_x$ and $HfSiO_x$.

4. The electronic device according to claim 1, further comprising a channel region in said semiconductor body, configured to accommodate, in use, an electric current, said electrical insulation region extending at said channel region.

5. The electronic device according to claim 4, having positive charge carriers at said first face defining a positive interface charge, said electrical insulation region being designed in such a way as to have trap states of electrons, which generate a negative charge such as to balance, at least in part, said positive interface charge.

6. The electronic device according to claim 1, wherein said electronic device is a MOSFET comprising a source terminal and a drain terminal, said electrical terminal being a gate terminal of the MOSFET, the conductive layer being a gate metallization, and the electrical insulation region forming, as a whole, a gate dielectric.

7. The electronic device according to claim 1, wherein said electronic device is a diode and includes:

a cathode terminal extending at the second face of the semiconductor body;

at least one trench extending from the first face towards the second face, said electrical insulation region extending into said trench;

wherein said electrical terminal forms an anode terminal of the diode and includes a metal layer having a portion extending into said trench, said electrical insulation region extending between said portion of the anode terminal and the semiconductor body.

8. The electronic device according to claim 7, wherein the diode is a Schottky diode comprising at least one metal-semiconductor junction formed by an electrical contact region between the anode terminal and the semiconductor body laterally to said trench.

9. A method of manufacturing an electronic device comprising:

providing a semiconductor body of Silicon Carbide, having a first and a second face, opposite to each other along a first direction;

forming an electrical terminal at the first face, including forming a conductive layer and an electrical insulation region between the conductive layer and the semiconductor body, configured to electrically insulate the electrical terminal from the semiconductor body, wherein the step of forming said electrical insulation region comprises forming a multilayer, including:

forming a first insulating layer in contact with the semiconductor body, having a first bandgap value and a first thickness, configured to be traversed, by tunnel effect, during use, by electric charge carriers coming from the semiconductor body;

forming a second insulating layer on the first insulating layer, having a second bandgap value lower than the first bandgap value and a second thickness greater than the first thickness, configured to form a potential well for said electric charge carriers; and forming a third insulating layer on the second insulating layer, having a third bandgap value comprised between the first and the second bandgap values and a third thickness greater than the second thickness, wherein:

the first insulating layer is of one from among: SiN, $SiO_2$, AlN;

the second insulating layer is of one from among: $HfO_2$, $HfSiO_x$, $ZrO_2$, $ZrSiO_x$; and the third insulating layer includes two or more alternating layers of an Aluminum Oxide and a Hafnium Oxide.

10. The method according to claim 9, wherein:

the first insulating layer has a thickness comprised between 0.5 nm and 1 nm;

the second insulating layer has a thickness comprised between 1.5 nm and 2.5 nm; and the third insulating layer has a thickness comprised between 10 and 100 nm.

11. The method according to claim 9, wherein the third insulating layer includes two or more alternating layers of Al2O3 and HfO2, or two or more alternating layers of AlSiOx and HfSiOx.

12. The method according to claim 9, wherein forming the second and the third insulating layers comprises performing respective depositions by ALD technique.

13. The method according to claim 9, further comprising a channel region in said semiconductor body, configured to accommodate, in use, an electric current, said electrical insulation region being formed at said channel region.

14. The method according to claim 9, wherein said electronic device is a MOSFET, the manufacturing comprising forming a source terminal and a drain terminal of the MOSFET, said electrical terminal being a gate terminal of the MOSFET, the conductive layer being a gate metallization, and the electrical insulation region forming, as a whole, a gate dielectric.

15. The method according to claim 9, wherein said electronic device is a diode, the manufacturing comprising:

forming a cathode terminal extending at the second face of the semiconductor body;

forming at least one trench extending from the first face towards the second face, said electrical insulation region extending into said trench;

wherein said electrical terminal is an anode terminal of the diode and includes a metal layer having a portion extending into said trench, said electrical insulation region extending between said portion of the anode terminal and the semiconductor body.

16. A device, comprising:

a Silicon Carbide body;

an electrical terminal on the body, including:

a first tunneling insulating layer in contact with the body, having a first bandgap value and a first thickness;

a second insulating layer on the first insulating layer, having a second bandgap value lower than the first bandgap value and a second thickness greater than the first thickness; and a third insulating layer on the second insulating layer, having a third bandgap value comprised between the first and the second bandgap values and a third thickness greater than the second thickness, wherein:

the first tunneling insulating layer is of one from among: SiN, $SiO_2$, AlN;

the second insulating layer is of one from among: $HfO_2$, $HfSiO_x$, $ZrO_2$, $ZrSiO_x$; and the third insulating layer includes two or more alternating layers of an Aluminum Oxide and a Hafnium Oxide.

17. The device according to claim 16, wherein:

the first tunneling insulating layer has a thickness comprised between 0.5 nm and 1 nm;

the second insulating layer has a thickness comprised between 1.5 nm and 2.5 nm; and the third insulating layer has a thickness comprised between 10 and 100 nm.

18. The device according to claim 16, wherein the third insulating layer includes two or more alternating layers of $Al_2O_3$ and $HfO_2$, or two or more alternating layers of $AlSiO_x$ and $HfSiO_x$.

19. The device according to claim 16, wherein said device is a MOSFET comprising a source terminal and a drain terminal, said electrical terminal being a gate terminal of the MOSFET.

20. The device according to claim 16, wherein said Silicon Carbide body has a first and a second face, opposite to each other along a first direction;

wherein said device is a diode and includes:

a cathode terminal extending at the second face of the semiconductor body;

at least one trench extending from the first face towards the second face, said electrical terminal extending into said trench;

wherein said electrical terminal forms an anode terminal of the diode and includes a metal layer having a portion extending into said trench.

* * * * *